United States Patent
Suzuki

(10) Patent No.: US 10,748,772 B2
(45) Date of Patent: Aug. 18, 2020

(54) DEVICE FORMING METHOD

(71) Applicant: SHIN-ETSU HANDOTAI CO., LTD., Tokyo (JP)

(72) Inventor: Katsuyoshi Suzuki, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/349,306

(22) PCT Filed: Sep. 15, 2017

(86) PCT No.: PCT/JP2017/033536
§ 371 (c)(1),
(2) Date: May 13, 2019

(87) PCT Pub. No.: WO2018/092401
PCT Pub. Date: May 24, 2018

(65) Prior Publication Data
US 2020/0194263 A1    Jun. 18, 2020

(30) Foreign Application Priority Data
Nov. 15, 2016    (JP) ................. 2016-222249

(51) Int. Cl.
*H01L 21/225*    (2006.01)
*H01L 21/265*    (2006.01)
(Continued)

(52) U.S. Cl.
CPC ........ *H01L 21/2253* (2013.01); *H01L 21/268* (2013.01); *H01L 21/26513* (2013.01); *H01L 21/324* (2013.01); *H01L 21/7624* (2013.01)

(58) Field of Classification Search
None
See application file for complete search history.

(56) References Cited

U.S. PATENT DOCUMENTS

| 6,087,247 A | 7/2000 | Downey |
| 6,218,270 B1 | 4/2001 | Yasunaga |
(Continued)

FOREIGN PATENT DOCUMENTS

| JP | H11-067683 A | 3/1999 |
| JP | H11-251260 A | 9/1999 |
(Continued)

OTHER PUBLICATIONS

"Effects of oxygen-inserted layers on diffusion of boron, phosphorus, and arsenic in silicon for ultra-shallow junction formation" by Zhang et al. (Year: 2018).*
(Continued)

*Primary Examiner* — Evren Seven
(74) *Attorney, Agent, or Firm* — Oliff PLC

(57) ABSTRACT

A device forming method including: forming a diffusion layer by ion-implanting a dopant into a silicon single crystal substrate; and activating the diffusion layer by laser annealing. When the silicon single crystal substrate to be used has an oxygen concentration of less than 5 ppma in a region for forming the diffusion layer, the device forming method includes a step of controlling the region for forming the diffusion layer to have an oxygen concentration of 5 ppma or more before the diffusion layer is activated by the laser annealing. A device forming method capable of easily enhancing dopant activation level by laser annealing even when a region for forming a diffusion layer has a low oxygen concentration.

20 Claims, 6 Drawing Sheets

(51) Int. Cl.
*H01L 21/762* (2006.01)
*H01L 21/324* (2006.01)
*H01L 21/268* (2006.01)

(56) References Cited

U.S. PATENT DOCUMENTS

| | | | |
|---|---|---|---|
| 2004/0235281 A1 | 11/2004 | Downey et al. | |
| 2014/0246755 A1* | 9/2014 | Yoshimura | H01L 29/7395 257/617 |
| 2015/0270132 A1* | 9/2015 | Laven | H01L 29/04 257/607 |
| 2016/0104622 A1* | 4/2016 | Oefner | H01L 29/1095 257/758 |
| 2016/0300938 A1* | 10/2016 | Tonari | H01L 29/7397 |
| 2016/0329401 A1* | 11/2016 | Laven | H01L 29/7393 |
| 2017/0243958 A1* | 8/2017 | Li | H01L 29/165 |
| 2018/0342402 A1* | 11/2018 | Hashigami | H01L 21/324 |

FOREIGN PATENT DOCUMENTS

| | | |
|---|---|---|
| JP | 2002-502124 A | 1/2002 |
| JP | 2007-535174 A | 11/2007 |
| JP | 2010-171057 A | 8/2010 |
| JP | 2016-096280 A | 5/2016 |
| WO | 2007/015388 A1 | 2/2007 |

OTHER PUBLICATIONS

Nov. 14, 2017 International Search Report issued in International Patent Application No. PCT/JP2017/033536.

Huet, K. et al. "High Performance and High Yield Junction Formation with Full Device Exposure Laser Thermal Annealing". International Image Sensor Workshop R12, 2011.

* cited by examiner

[FIG. 1]
| Prepare silicon single crystal wafer having oxygen concentration of less than 5 ppma in diffusion-layer forming region | S11 |
| Control diffusion-layer forming region to have oxygen concentration of 5 ppma or more | S12 |
| Form diffusion layer by ion-implanting dopant | S13 |
| Activate diffusion layer by laser annealing | S14 |

[FIG. 2]
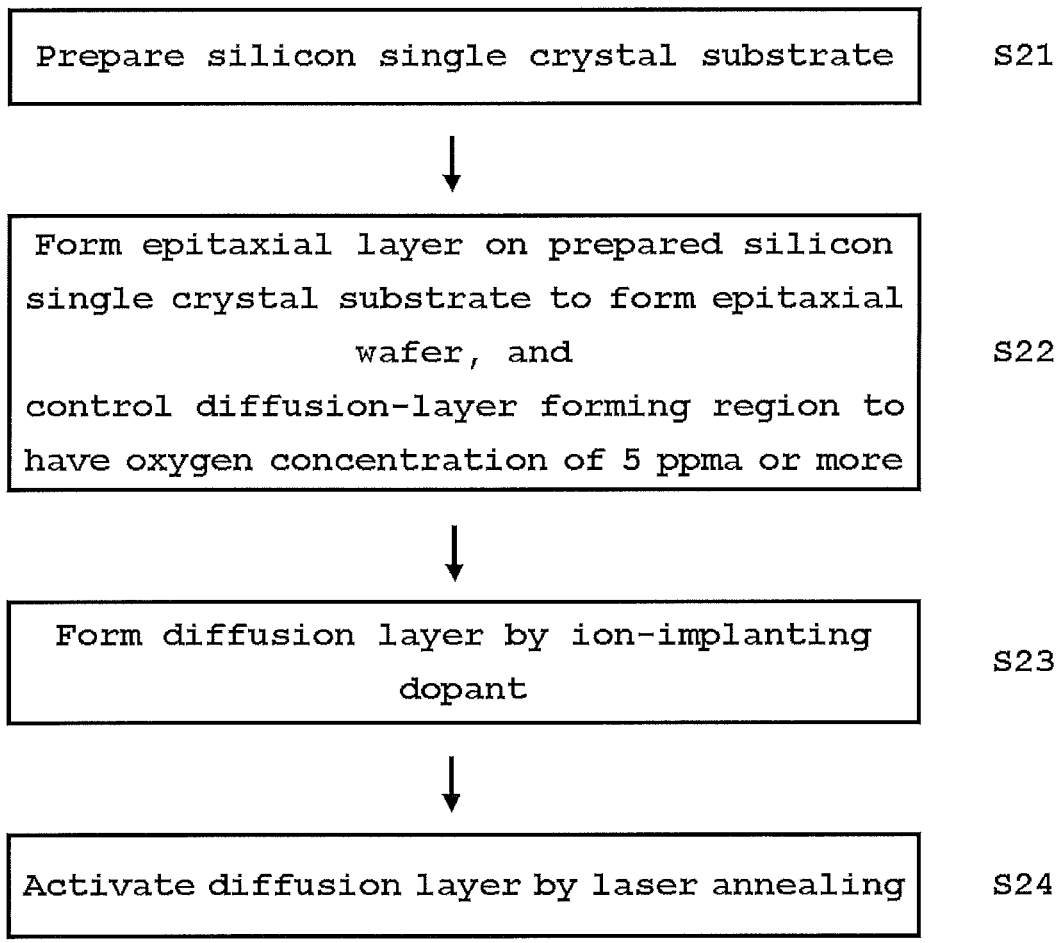

[FIG. 3]
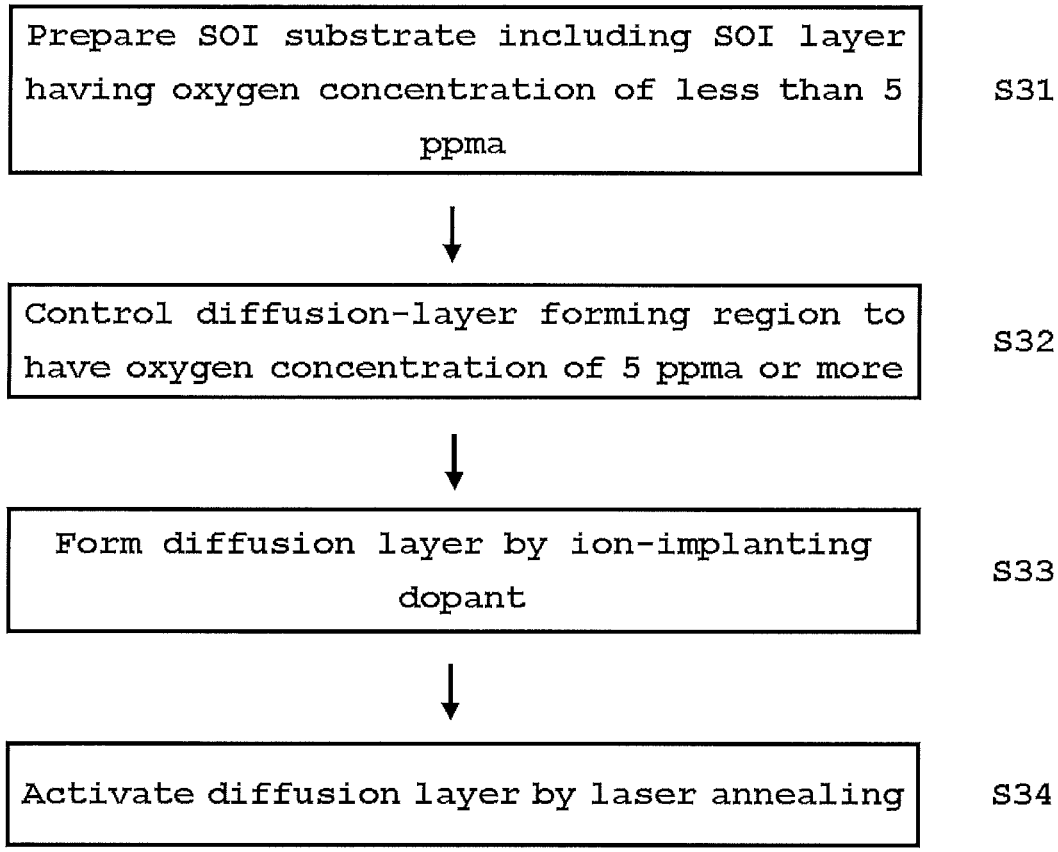

[FIG. 4]
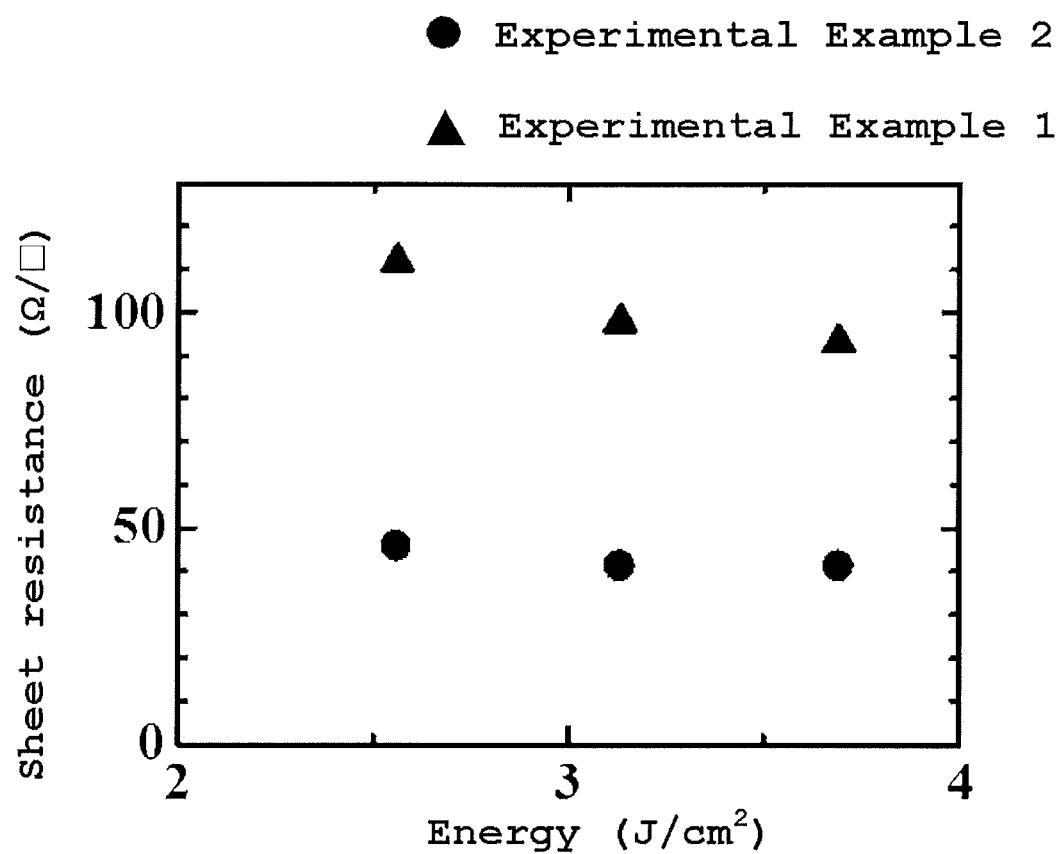

[FIG. 5]
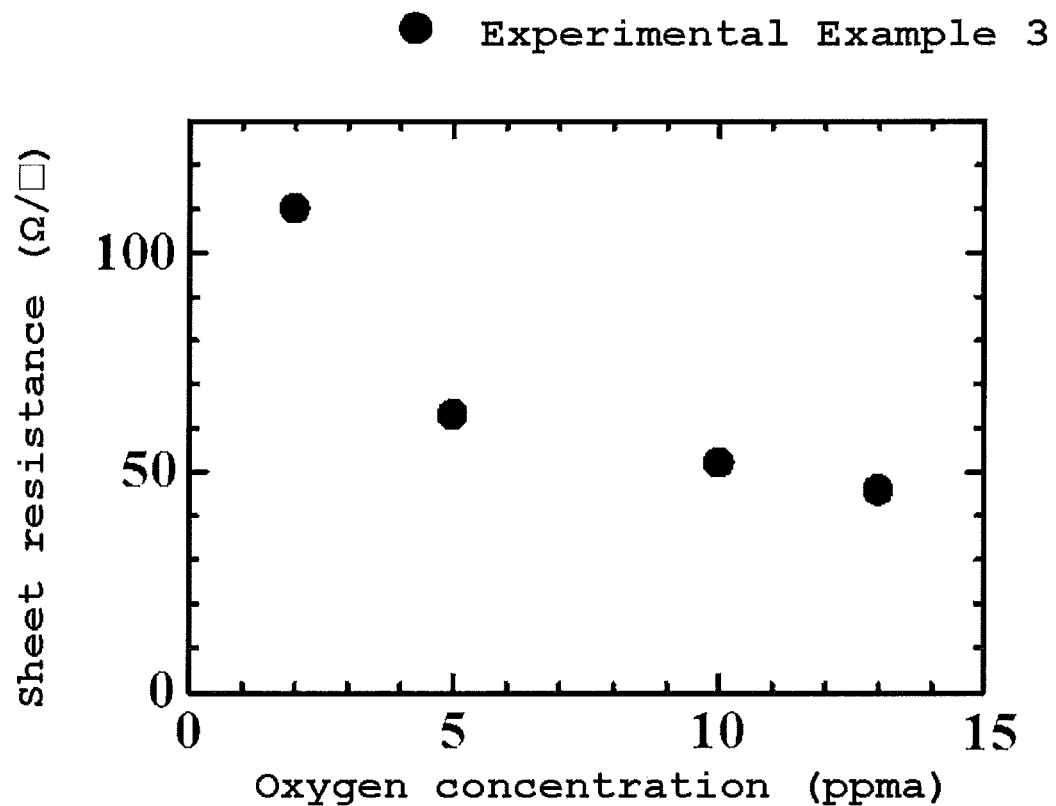

[FIG. 6]
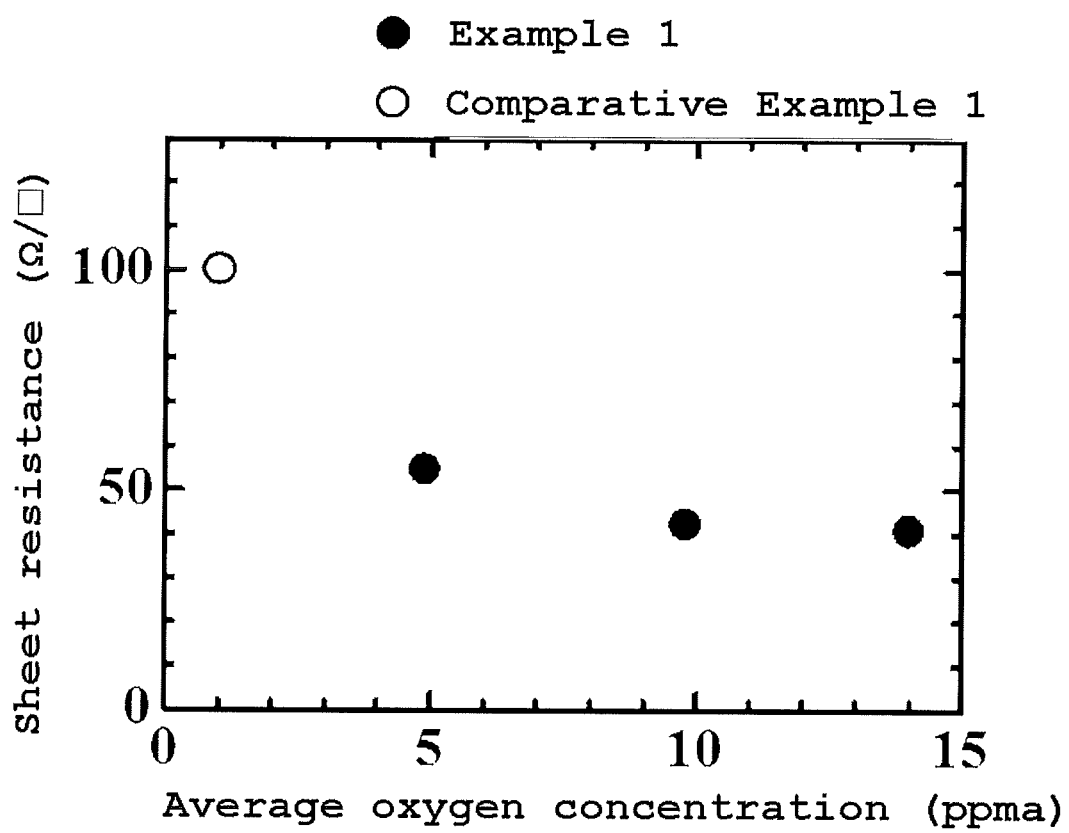

DEVICE FORMING METHOD

TECHNICAL FIELD

The present invention relates to a device forming method employed in a device manufacturing process including a step of electrically activating a dopant by laser annealing.

BACKGROUND ART

In the process for manufacturing a semiconductor device, for example, diffusion layers as source and drain regions are formed by ion-implanting a dopant. Then, annealing is performed to recover a defect caused by the ion implantation and to electrically activate the dopant (to decrease the resistance). Meanwhile, this annealing has such a problem that the ion-implanted atoms diffuse and expand the diffusion layers. Along with the recent advancement in miniaturization, such diffusion layers need to be formed as shallow as 50 nm or less. Since conventionally employed furnace anneal and RTA (Rapid Thermal Anneal) require long heating times and expand diffusion layers, annealing methods for applying high energy within a very short time are thus adopted.

As the annealing method, a flash lamp annealing method has been adopted which uses a flash lamp having a rare gas such as xenon sealed therein to apply pulsed light of 0.1 to 100 msec for heating. Furthermore, a laser annealing method has been recently studied which can further shorten the heating time by applying pulsed laser beam for 10 to 1000 nsec for heating.

Meanwhile, in the step of activating an impurity which is ion-implanted into the back surfaces of a power device IGBT (Insulated Gate Bipolar Transistor) and back-side illuminated image sensor, laser annealing is sometimes employed which can selectively heat only the back surface side within a short heating time so as to avoid thermal damage to a device layer on the front surface side (for example, Patent Document 1, Non Patent Document 1).

The laser annealing method forms a melted portion by laser irradiation, while a dopant can be activated by epitaxial growth utilizing a non-melted portion as a seed crystal (for example, Non Patent Document 1). Additionally, to increase the activation level, there have been proposed: a method in which laser beams with different pulse widths are combined for the activation (for example, Patent Document 2); and a method in which laser beams with different wavelengths are combined for the activation (for example, Patent Document 3).

CITATION LIST

Patent Literature

Patent Document 1: Japanese Unexamined Patent Publication (Kokai) No. 2010-171057
Patent Document 2: Japanese Unexamined Patent Publication (Kokai) No. 2016-096280
Patent Document 3: WO2007/015388

Non Patent Literature

Non Patent Document 1: K. Huet, et. al., 2011 INTERNATIONAL IMAGE SENSOR WORKSHOP R12 (2011)

SUMMARY OF INVENTION

Technical Problem

However, the above-described conventional techniques have a problem that the apparatus configuration is made complex to increase the activation level of an implanted dopant. As a result of further studies, the inventor has found such a problem that particularly when a region for forming a diffusion layer has a low oxygen concentration, the activation level of an implanted dopant is low, and the sheet resistance of the diffusion layer cannot be decreased sufficiently. The inventor has revealed that even in a case where a CZ silicon single crystal substrate is used, when IG treatment or the like is performed, a DZ layer having a low oxygen concentration is formed in the surface region, and a region for forming a diffusion layer has a low oxygen concentration.

The present invention has been made in view of the above-described problems of the conventional techniques. An object of the present invention is to provide a device forming method capable of easily enhancing dopant activation level by laser annealing even when a region for forming a diffusion layer has a low oxygen concentration.

Solution to Problem

To achieve the object, the present invention provides a device forming method comprising: forming a diffusion layer by ion-implanting a dopant into a silicon single crystal substrate; and activating the diffusion layer by laser annealing, wherein when the silicon single crystal substrate to be used has an oxygen concentration of less than 5 ppma in a region for forming the diffusion layer, the device forming method comprises a step of controlling the region for forming the diffusion layer to have an oxygen concentration of 5 ppma or more before the diffusion layer is activated by the laser annealing.

Controlling the region for forming the diffusion layer to have an oxygen concentration of 5 ppma or more in this manner increases oxygen more than the amount of defect generated during the laser annealing. This can suppress the defect formation, making it possible to easily enhance the dopant activation level.

In this event, any of an FZ silicon single crystal substrate, an MCZ silicon single crystal substrate, and a CZ silicon single crystal substrate having a DZ layer formed in an IG-treated surface region can be used as the silicon single crystal substrate.

The above-described substrates can be suitably used as the silicon single crystal substrate having an oxygen concentration of less than 5 ppma in the region for forming the diffusion layer.

In this event, as a method for controlling the region for forming the diffusion layer to have an oxygen concentration of 5 ppma or more, the silicon single crystal substrate can be heated in an oxygen atmosphere, thereby inwardly diffusing oxygen into the region for forming the diffusion layer.

Employing such a method makes it possible to control only regions for forming the diffusion layer on the front surface side and the back surface side of the substrate to have an oxygen concentration of 5 ppma or more.

In this event, as a method for controlling the region for forming the diffusion layer to have an oxygen concentration of 5 ppma or more, oxygen-containing ions can be implanted into the silicon single crystal substrate, thereby making the region for forming the diffusion layer have an oxygen concentration of 5 ppma or more.

Employing such a method makes it possible to control the region for forming the diffusion layer only in a predetermined region in the substrate surface to have an oxygen concentration of 5 ppma or more.

Moreover, the present invention provides a device forming method comprising: forming a diffusion layer by ion-implanting a dopant into an epitaxial wafer having an epitaxial layer formed on a silicon single crystal substrate; and activating the diffusion layer by laser annealing, wherein the device forming method comprises a step of controlling a region for forming the diffusion layer to have an oxygen concentration of 5 ppma or more before the diffusion layer is activated by the laser annealing.

Controlling the region for forming the diffusion layer to have an oxygen concentration of 5 ppma or more in this manner increases oxygen more than the amount of defect generated during the laser annealing. This can suppress the defect formation, making it possible to easily enhance the dopant activation level. Moreover, the inventive device forming method is suitably applicable to a case where a device is formed using a high-quality epitaxial wafer which has fewer defects than a polished wafer, but which hardly contains oxygen in an epitaxial layer.

In this event, as a method for controlling the region for forming the diffusion layer to have an oxygen concentration of 5 ppma or more, a silicon single crystal substrate having an oxygen concentration of 5 ppma or more can be used, and a step of forming the epitaxial layer can involve outwardly diffusing oxygen from the silicon single crystal substrate into the region for forming the diffusion layer.

Employing such a method can readily introduce oxygen into the epitaxial layer.

In this event, as a method for controlling the region for forming the diffusion layer to have an oxygen concentration of 5 ppma or more, a silicon single crystal substrate having an oxygen concentration of 5 ppma or more can be used, and after the epitaxial layer is formed, the epitaxial wafer can be heated in a non-oxidizing atmosphere, thereby outwardly diffusing oxygen from the silicon single crystal substrate into the region for forming the diffusion layer.

Employing such a method can introduce oxygen into the epitaxial layer at any timing after the epitaxial layer formation but before the laser annealing.

In this event, as a method for controlling the region for forming the diffusion layer to have an oxygen concentration of 5 ppma or more, after the epitaxial layer is formed, the epitaxial wafer can be heated in an oxygen atmosphere, thereby inwardly diffusing oxygen into the region for forming the diffusion layer.

Employing such a method makes it possible to control the region for forming the diffusion layer only on the front surface side to have an oxygen concentration of 5 ppma or more.

In this event, as a method for controlling the region for forming the diffusion layer to have an oxygen concentration of 5 ppma or more, after the epitaxial layer is formed, oxygen-containing ions can be implanted into the epitaxial layer of the epitaxial wafer.

Employing such a method makes it possible to control the region for forming the diffusion layer only in a predetermined region in the wafer surface to have an oxygen concentration of 5 ppma or more.

In this event, as a method for controlling the region for forming the diffusion layer to have an oxygen concentration of 5 ppma or more, a step of forming the epitaxial layer can involve doping the epitaxial layer with oxygen.

Employing such a method attains a uniform oxygen distribution in the epitaxial layer.

Further, the present invention provides a device forming method comprising: forming a diffusion layer by ion-implanting a dopant into an SOI substrate; and activating the diffusion layer by laser annealing, wherein when the SOI substrate to be used includes an SOI layer having an oxygen concentration of less than 5 ppma, the device forming method comprises a step of controlling a region for forming the diffusion layer to have an oxygen concentration of 5 ppma or more before the diffusion layer is activated by the laser annealing.

Controlling the region for forming the diffusion layer to have an oxygen concentration of 5 ppma or more in this manner increases oxygen more than the amount of defect generated during the laser annealing. This can suppress the defect formation, making it possible to easily enhance the dopant activation level. Additionally, the inventive device forming method is suitably applicable to a case where a device is formed using an SOI substrate having an SOI layer with a low oxygen concentration.

In this event, as a method for controlling the region for forming the diffusion layer to have an oxygen concentration of 5 ppma or more, the SOI substrate can be heated in an oxygen atmosphere, thereby inwardly diffusing oxygen into the region for forming the diffusion layer.

Employing such a method makes it possible to control the region for forming the diffusion layer only on the front surface side to have an oxygen concentration of 5 ppma or more.

In this event, as a method for controlling the region for forming the diffusion layer to have an oxygen concentration of 5 ppma or more, oxygen-containing ions can be implanted into the SOI layer of the SOI substrate.

Employing such a method makes it possible to control the region for forming the diffusion layer only in a predetermined region in the substrate surface to have an oxygen concentration of 5 ppma or more.

The dopant can contain any one element of boron, aluminum, gallium, phosphorus, arsenic, and antimony.

Such a dopant can surely form a p-type region or an n-type region in the region for forming the diffusion layer made of silicon.

In this event, the dopant is preferably ion-implanted at a dose of $1 \times 10^{12}$ atoms/cm$^2$ or more.

Such a dose surely enables a PN junction to be formed between the region for forming the diffusion layer and a region immediately therebelow.

The laser annealing preferably uses an excimer laser having a wavelength of 308 nm.

When an excimer laser is used with a wavelength of 308 nm as described above, a laser-irradiated portion can be selectively heated because the light penetration length is 10 nm.

In this event, the laser annealing is preferably performed with a laser energy greater than an energy for melting a silicon single crystal.

Melting the silicon single crystal allows the dopant to easily enter its substitution position, making it possible to more effectively increase the activation level.

In this event, the laser annealing is preferably performed with a laser irradiation time of 10 to 1000 nsec.

With such an irradiation time, since the irradiation time is short, a laser-irradiated portion can be selectively heated.

Advantageous Effects of Invention

As described above, even when a high-quality silicon single crystal substrate having a low oxygen concentration is used, the inventive device forming method controls the region for forming the diffusion layer to have an oxygen concentration of 5 ppma or more, and increases oxygen more than the amount of defect generated during the laser annealing. Thus, the defect formation can be suppressed, making it possible to easily enhance the dopant activation level.

BRIEF DESCRIPTION OF DRAWINGS

FIG. 1 is a flowchart for illustrating a device forming method according to a first embodiment of the present invention.

FIG. 2 is a flowchart for illustrating a device forming method according to a second embodiment of the present invention.

FIG. 3 is a flowchart for illustrating a device forming method according to a third embodiment of the present invention.

FIG. 4 is a graph for illustrating the result of measuring the sheet resistance in Experimental Examples 1 and 2.

FIG. 5 is a graph for illustrating a relation between the oxygen concentration and the sheet resistance of polished wafers in Experimental Example 3.

FIG. 6 is a graph for illustrating a relation between the oxygen concentration and the sheet resistance of regions for forming diffusion layers in Example 1 and Comparative Example 1 when oxygen ions were implanted into epitaxial wafers.

DESCRIPTION OF EMBODIMENTS

As described above, in the conventional techniques, the dopant activation level has been increased by managing laser irradiation conditions such as by the method in which laser beams with different pulse widths are combined, and the method in which laser beams with different wavelengths are combined. However, there is a problem that the apparatus configuration has to be greatly changed. The present inventor has studied and consequently found a problem that particularly when a region for forming a diffusion layer has a low oxygen concentration, the activation level of an implanted dopant is low, and the sheet resistance of the diffusion layer cannot be decreased sufficiently. The inventor has revealed that even in a case where a CZ silicon single crystal substrate is used, when IG treatment or the like is subjected, a DZ layer having a low oxygen concentration is formed in the surface region, and a region for forming a diffusion layer has a low oxygen concentration. Particularly, these are conspicuous in: an epitaxial wafer having an epitaxial layer hardly containing oxygen; and an SOI substrate having an SOI layer hardly containing oxygen due to outward diffusion.

Hence, the present inventor has earnestly studied a method for easily enhancing the activation level without changing the apparatus configuration even when a region for forming a diffusion layer has a low oxygen concentration.

Consequently, the present inventor has found out that when a region for forming a diffusion layer to be used has an oxygen concentration of less than 5 ppma, the dopant activation level can be enhanced by making the region for forming the diffusion layer have an oxygen concentration of 5 ppma or more before laser annealing. Thus, the present invention has been completed.

Hereinafter, examples of embodiments of the present invention will be described in detail with reference to the drawings. However, the present invention is not limited thereto.

First, a device forming method according to a first embodiment of the present invention will be described with reference to FIG. 1.

A silicon single crystal substrate having an oxygen concentration of less than 5 ppma in a region for forming a diffusion layer is prepared (see S11 in FIG. 1).

As the silicon single crystal substrate having an oxygen concentration of less than 5 ppma in the region for forming the diffusion layer, it is possible to use any of an FZ silicon single crystal substrate, an MCZ silicon single crystal substrate, and a CZ silicon single crystal substrate having a DZ layer formed in an IG-treated surface region.

The above substrates can be suitably used as the silicon single crystal substrate having an oxygen concentration of less than 5 ppma in the region for forming the diffusion layer.

Next, the region for forming the diffusion layer in the silicon single crystal substrate thus prepared is controlled to have an oxygen concentration of 5 ppma or more (see S12 in FIG. 1). The upper limit of the oxygen concentration in the region for forming the diffusion layer is not particularly limited, and can be 18 ppma or less, for example. This is to prevent excessive oxide precipitate, which leads to slip dislocation, when the oxygen concentration is too high.

As a method for controlling the region for forming the diffusion layer to have an oxygen concentration of 5 ppma or more, a heat treatment may be performed in an oxygen atmosphere, thereby inwardly diffusing oxygen into the region for forming the diffusion layer to form a device.

Employing such a method makes it possible to control only regions for forming the diffusion layer on the front surface side and the back surface side to have an oxygen concentration of 5 ppma or more.

The heating temperature in the oxygen atmosphere is desirably 1100° C. or more. At such a heating temperature, the solid solubility of oxygen is 5 ppma or more, enabling the control, so that the region for forming the diffusion layer has an oxygen concentration of 5 ppma or more. Even when the temperature of silicon in the region for forming the diffusion layer is at the melting point or higher, oxygen may be introduced by keeping the holding portion of the silicon single crystal substrate at the melting point or lower, so that the region for forming the diffusion layer has an oxygen concentration of 5 ppma or more.

The heating time in the oxygen atmosphere can be changed according to the depth where the diffusion layer is formed. In the RTA (Rapid Thermal Anneal) treatment, 0.1 seconds or more is desirable. In the FA (Furnace Anneal) treatment, 1 minute or more is desirable.

After the heating in the oxygen atmosphere, an oxide film adhering on the periphery (the surface of the silicon single crystal substrate) can be removed with hydrofluoric acid; thereafter, the diffusion layer can be formed. In this case also, the effects of the present invention are obtained.

Meanwhile, in the process of lowering the temperature after the heating in the oxygen atmosphere, when oxygen outwardly diffuses and the oxygen concentrations on the front surface side and the back surface side become less than 5 ppma, the front surface side or the back surface side can be polished to make the oxygen concentration on the front surface side or the back surface side 5 ppma or more; then, the diffusion layer to be described later can be formed. In this case also, the effects of the present invention can be obtained.

Alternatively, as the method for controlling the region for forming the diffusion layer to have an oxygen concentration of 5 ppma or more, oxygen-containing ions can be implanted to thereby make the region for forming the diffusion layer have an oxygen concentration of 5 ppma or more.

Employing such a method makes it possible to control the region for forming the diffusion layer to have an oxygen concentration of 5 ppma or more in only a predetermined region in the substrate surface.

The ions to be implanted may be oxygen ions, or a cluster ion containing oxygen may be implanted.

The ion implantation energy should be changed depending on the depth where the region for forming the diffusion layer is formed, and is not particularly limited. For example, when oxygen ions are used, the energy can be 0.5 keV to 3 MeV. When a cluster ion containing oxygen is used, the energy can be 3 to 100 keV/cluster.

The ion implantation dose varies depending on the energy. Nevertheless, setting the dose at $1 \times 10^{11}$ atoms/cm$^2$ or more allows the oxygen introduction of 5 ppma or more. Moreover, setting the ion implantation dose at $2 \times 10^{14}$ atoms/cm$^2$ or less promotes efficiency because the time required for the ion implantation is not too long.

Without heating for recovery from damage due to the implantation of the oxygen-containing ions, the diffusion layer can be formed by ion-implanting a dopant as described later. Alternatively, after the heating is performed for recovery from damage due to the implantation of the oxygen-containing ions, the diffusion layer can be formed by ion-implanting a dopant as described later.

Next, the diffusion layer is formed by ion-implanting a dopant into the silicon single crystal substrate controlled to have an oxygen concentration of 5 ppma or more in the region for forming the diffusion layer (see S13 in FIG. 1).

The dopant to be ion-implanted can be atoms and molecules containing any one element of boron, aluminum, gallium, phosphorus, arsenic, and antimony. As the molecules, for example, $BF_2$ and $B_xH_y$ (x, y denote numbers) are usable. Such atoms and molecules can surely form a p-type region or an n-type region in the diffusion-layer forming region made of silicon.

The dopant is preferably ion-implanted at a dose of $1 \times 10^{12}$ atoms/cm$^2$ or more.

Such a dose surely enables formation of a PN junction between the region for forming the diffusion layer and a region immediately therebelow.

Next, in the silicon single crystal substrate in which the diffusion layer has been formed by ion-implanting the dopant, the diffusion layer is activated by laser annealing (see S14 in FIG. 1).

The laser annealing preferably uses an excimer laser having a wavelength of 308 nm.

The use of such an excimer laser with a wavelength of 308 nm enables selective heating at a laser-irradiated portion because the light penetration length is 10 nm.

The laser annealing is preferably performed with a laser energy greater than an energy for melting a silicon single crystal.

Although the dopant is activated without melting the silicon single crystal, melting the silicon single crystal facilitates the entry of the dopant into the substitution position, and the activation level can be increased more effectively.

The laser annealing is preferably performed with a laser irradiation time of 10 to 1000 nsec.

Since such an irradiation time is a short irradiation time, a laser-irradiated portion can be selectively heated.

The device forming method according to the first embodiment of the present invention described above controls the region for forming the diffusion layer to have an oxygen concentration of 5 ppma or more, and increases oxygen more than the amount of defect generated during the laser annealing. The defect formation can be suppressed, and the dopant activation level can be easily enhanced.

Note that, hereinabove, the description has been given of the case where the step of controlling the region for forming the diffusion layer to have an oxygen concentration of 5 ppma or more (S12 in FIG. 1) is performed before the step of forming the diffusion layer by ion-implanting the dopant (S13 in FIG. 1). Nevertheless, it is only necessary that the step of controlling the region for forming the diffusion layer to have an oxygen concentration of 5 ppma or more should be performed before the step of activating the diffusion layer by laser annealing (S14 in FIG. 1). The step of controlling the region for forming the diffusion layer to have an oxygen concentration of 5 ppma or more may be performed after the step of forming the diffusion layer by ion-implanting the dopant. For example, the oxygen-containing ions may be implanted before the dopant ion implantation or after the dopant ion implantation.

Next, a device forming method according to a second embodiment of the present invention will be described with reference to FIG. 2.

First, a silicon single crystal substrate is prepared (see S21 in FIG. 2).

Next, an epitaxial layer is formed on the prepared silicon single crystal substrate to form an epitaxial wafer. A region for forming a diffusion layer in the epitaxial wafer is controlled to have an oxygen concentration of 5 ppma or more (see S22 in FIG. 2). The upper limit of the oxygen concentration in the region for forming the diffusion layer is not particularly limited, and can be 18 ppma or less, for example. This is to prevent excessive oxide precipitate, which leads to slip dislocation, when the oxygen concentration is too high.

As the method for controlling the region for forming the diffusion layer to have an oxygen concentration of 5 ppma or more, a silicon single crystal substrate having an oxygen concentration of 5 ppma or more can be used, and the step of forming the epitaxial layer can involve outwardly diffusing oxygen from the silicon single crystal substrate into the region for forming the diffusion layer.

Employing such a method can facilitate the oxygen introduction into the epitaxial layer.

Additionally, polishing may be performed after the epitaxial growth. Thereby, the region having oxygen of 5 ppma or more diffused from the substrate is located on the front surface side of the epitaxial layer, enabling the region for forming the diffusion layer to have the concentration of 5 ppma or more.

Alternatively, as the method for controlling the region for forming the diffusion layer to have an oxygen concentration of 5 ppma or more, a silicon single crystal substrate having an oxygen concentration of 5 ppma or more can be used, and after the epitaxial layer is formed, the epitaxial wafer can be heated in a non-oxidizing atmosphere, thereby outwardly diffusing oxygen from the silicon single crystal substrate into the region for forming the diffusion layer.

Employing such a method enables the oxygen introduction into the epitaxial layer at any timing after the epitaxial layer formation but before laser annealing described later.

Here, to shorten the heating time, the heating temperature is desirably 1000° C. or more. Meanwhile, the heating time is desirably longer than 30 seconds.

After oxygen is outwardly diffused from the silicon single crystal substrate, polishing may be performed as described above.

As the method for controlling the region for forming the diffusion layer to have an oxygen concentration of 5 ppma or more, after the epitaxial layer is formed, the epitaxial wafer can be heated in an oxygen atmosphere, thereby inwardly diffusing oxygen into the region for forming the diffusion layer.

Employing such a method makes it possible to control only the region for forming the diffusion layer on the front surface side to have an oxygen concentration of 5 ppma or more.

Here, the heating temperature in the oxygen atmosphere is desirably 1100° C. or more. At such a heating temperature, the solid solubility of oxygen is 5 ppma or more, enabling the control, so that the region for forming the diffusion layer has an oxygen concentration of 5 ppma or more. Even when the temperature of silicon in the region for forming the diffusion layer is at the melting point or higher, oxygen may be introduced by keeping the holding portion of the silicon single crystal substrate at the melting point or lower, so that the region for forming the diffusion layer has an oxygen concentration of 5 ppma or more.

The heating time in the oxygen atmosphere can be changed according to the depth where the diffusion layer is formed. In the RTA (Rapid Thermal Anneal) treatment, 0.1 seconds or more is desirable. In the FA (Furnace Anneal) treatment, 1 minute or more is desirable.

After the heating in the oxygen atmosphere, an oxide film adhering on the periphery (the surface of the silicon single crystal substrate) can be removed with hydrofluoric acid; thereafter, the diffusion layer can be formed as described later. In this case also, the effects of the present invention are obtained.

Meanwhile, in the process of lowering the temperature after the heating in the oxygen atmosphere, when oxygen outwardly diffuses and the oxygen concentration on the front surface side becomes less than 5 ppma, the front surface can be polished to expose a portion where the oxygen concentration is 5 ppma or more on the front surface side; then, the diffusion layer to be described later can be formed. In this case also, the effects of the present invention can be obtained.

In this event, as the method for controlling the region for forming the diffusion layer to have an oxygen concentration of 5 ppma or more, after the epitaxial layer is formed, oxygen-containing ions can be implanted into the epitaxial layer of the epitaxial wafer. Employing such a method makes it possible to control the region for forming the diffusion layer to have an oxygen concentration of 5 ppma or more in only a predetermined region in the wafer surface.

The ions to be implanted may be oxygen ions, or a cluster ion containing oxygen may be implanted.

The ion implantation energy should be changed depending on the depth where the region for forming the diffusion layer is formed, and is not particularly limited. For example, in the case of oxygen, the energy can be 0.5 keV to 3 MeV. When a cluster ion is used, the energy can be 3 to 100 keV/cluster.

The ion implantation dose varies depending on the energy. Nevertheless, setting the dose at $1 \times 10^{11}$ atoms/cm$^2$ or more allows the oxygen introduction of 5 ppma or more. Moreover, setting the ion implantation dose at $2 \times 10^{14}$ atoms/cm$^2$ or less promotes efficiency because the time required for the ion implantation is not too long.

Without heating for recovery from damage due to the implantation of the oxygen-containing ions, the diffusion layer can be formed by ion-implanting a dopant as described later. Alternatively, after the heating is performed for recovery from damage due to the implantation of the oxygen-containing ions, the diffusion layer can be formed by ion-implanting a dopant as described later.

As the method for controlling the region for forming the diffusion layer to have an oxygen concentration of 5 ppma or more, the step of forming the epitaxial layer can involve doping the epitaxial layer with oxygen. Employing such a method attains a uniform oxygen distribution in the epitaxial layer. This can be achieved by mixing an oxygen-containing gas into the growth gas during the vapor-phase growth of the epitaxial layer.

Next, the diffusion layer is formed by ion-implanting a dopant into the silicon epitaxial wafer controlled to have an oxygen concentration of 5 ppma or more in the region for forming the diffusion layer (see S23 in FIG. 2).

The dopant to be implanted can be atoms and molecules containing any one element of boron, aluminum, gallium, phosphorus, arsenic, and antimony. As the molecules, for example, $BF_2$ and $B_xH_y$ (x, y denote numbers) are usable. Such atoms and molecules can surely form a p-type region or an n-type region in the diffusion-layer forming region made of silicon.

The dopant is preferably ion-implanted at a dose of $1 \times 10^{12}$ atoms/cm$^2$ or more.

Such a dose surely enables formation of a PN junction between the region for forming the diffusion layer and a region immediately therebelow.

Next, in the silicon epitaxial wafer in which the diffusion layer has been formed by ion-implanting the dopant, the diffusion layer is activated by laser annealing (see S24 in FIG. 2).

The laser annealing preferably uses an excimer laser having a wavelength of 308 nm.

The use of such an excimer laser with a wavelength of 308 nm enables selective heating at a laser-irradiated portion because the light penetration length is 10 nm.

The laser annealing is preferably performed with a laser energy greater than an energy for melting a silicon single crystal.

Although the dopant is activated without melting the silicon single crystal, melting the silicon single crystal facilitates the entry of the dopant into the substitution position, and the activation level can be increased more effectively.

The laser annealing is preferably performed with a laser irradiation time of 10 to 1000 nsec.

Since such an irradiation time is a short irradiation time, a laser-irradiated portion can be selectively heated.

The device forming method according to the second embodiment of the present invention described above controls the region for forming the diffusion layer to have an oxygen concentration of 5 ppma or more, and increases oxygen more than the amount of defect generated during the laser annealing. The defect formation can be suppressed, and the dopant activation level can be easily enhanced. In addition, the device forming method according to the second embodiment of the present invention is suitably applicable to a case where a device is formed using a high-quality epitaxial wafer having fewer defects than a polished wafer.

Note that, hereinabove, the description has been given of the case where the step of controlling the region for forming the diffusion layer to have an oxygen concentration of 5 ppma or more is performed before the step of forming the diffusion layer by ion-implanting the dopant (S23 in FIG. 2). Nevertheless, it is only necessary that the step of controlling the region for forming the diffusion layer to have an oxygen concentration of 5 ppma or more should be performed before the step of activating the diffusion layer by laser annealing (S24 in FIG. 2). The step of controlling the region for forming the diffusion layer to have an oxygen concentration of 5 ppma or more may be performed after the step of forming the diffusion layer by ion-implanting the dopant. For example, the oxygen-containing ions may be implanted before the dopant ion implantation or after the dopant ion implantation.

Next, a device forming method according to a third embodiment of the present invention will be described with reference to FIG. 3.

First, an SOI substrate including an SOI layer having an oxygen concentration of less than 5 ppma is prepared (see S31 in FIG. 3).

Next, a region for forming a diffusion layer in the prepared SOI substrate is controlled to have an oxygen concentration of 5 ppma or more (see S32 in FIG. 3). The upper limit of the oxygen concentration in the region for forming the diffusion layer is not particularly limited, and can be 18 ppma or less, for example. This is to prevent excessive oxide precipitate, which leads to slip dislocation, when the oxygen concentration is too high.

In this event, as the method for controlling the region for forming the diffusion layer to have an oxygen concentration of 5 ppma or more, the SOI substrate can be heated in an oxygen atmosphere, thereby inwardly diffusing oxygen into the region for forming the diffusion layer. Employing such a method makes it possible to control only the region for forming the diffusion layer on the front surface side to have an oxygen concentration of 5 ppma or more.

Here, the heating temperature in the oxygen atmosphere is desirably 1100° C. or more. At such a heating temperature, the solid solubility of oxygen is 5 ppma or more, enabling the control, so that the region for forming the diffusion layer has an oxygen concentration of 5 ppma or more. Even when the temperature of silicon in the region for forming the diffusion layer is at the melting point or higher, oxygen may be introduced by keeping the holding portion of the silicon single crystal substrate at the melting point or lower, so that the region for forming the diffusion layer has an oxygen concentration of 5 ppma or more.

The heating time in the oxygen atmosphere can be changed according to the depth where the diffusion layer is formed. In the RTA (Rapid Thermal Anneal) treatment, 0.1 seconds or more is desirable. In the FA (Furnace Anneal) treatment, 1 minute or more is desirable.

After the heating in the oxygen atmosphere, an oxide film adhering on the periphery (the surface of the SOI substrate) can be removed with hydrofluoric acid; thereafter, the diffusion layer can be formed as described later. In this case also, the effects of the present invention are obtained.

In this event, as the method for controlling the region for forming the diffusion layer to have an oxygen concentration of 5 ppma or more, oxygen-containing ions can be implanted into the SOI layer of the SOI substrate.

Employing such a method makes it possible to control the region for forming the diffusion layer to have an oxygen concentration of 5 ppma or more in only a predetermined region in the substrate surface.

The ions to be implanted may be oxygen ions, or a cluster ion containing oxygen may be implanted.

The ion implantation energy should be changed depending on the depth where the region for forming the diffusion layer is formed, and is not particularly limited. For example, when oxygen ions are used, the energy can be 0.5 keV to 3 MeV. When a cluster ion containing oxygen is used, the energy can be 3 to 100 keV/cluster.

The ion implantation dose varies depending on the energy. Nevertheless, setting the dose at $1 \times 10^{11}$ atoms/cm$^2$ or more allows the oxygen introduction of 5 ppma or more. Moreover, setting the ion implantation dose at $2 \times 10^{14}$ atoms/cm$^2$ or less promotes efficiency because the time required for the ion implantation is not too long.

Without heating for recovery from damage due to the implantation of the oxygen-containing ions, the diffusion layer can be formed by ion-implanting a dopant as described later. Alternatively, after the heating is performed for recovery from damage due to the implantation of the oxygen-containing ions, the diffusion layer can be formed by ion-implanting a dopant as described later.

Next, the diffusion layer is formed by ion-implanting a dopant into the SOI layer of the SOI substrate controlled to have an oxygen concentration of 5 ppma or more in the region for forming the diffusion layer (see S33 in FIG. 3).

The dopant to be implanted can be atoms and molecules containing any one element of boron, aluminum, gallium, phosphorus, arsenic, and antimony. As the molecules, for example, $BF_2$ and $B_xH_y$ (x, y denote numbers) are usable. Such atoms and molecules can surely form a p-type region or an n-type region in the diffusion-layer forming region made of silicon.

The dopant is preferably ion-implanted at a dose of $1 \times 10^{12}$ atoms/cm$^2$ or more.

Such a dose surely enables formation of a PN junction between the region for forming the diffusion layer and a region immediately therebelow.

Next, in the SOI substrate in which the diffusion layer has been formed by ion-implanting the dopant, the diffusion layer is activated by laser annealing (see S34 in FIG. 3).

The laser annealing preferably uses an excimer laser having a wavelength of 308 nm.

The use of such an excimer laser with a wavelength of 308 nm enables selective heating at a laser-irradiated portion because the light penetration length is 10 nm.

The laser annealing is preferably performed with a laser energy greater than an energy for melting a silicon single crystal.

Although the dopant is activated without melting the silicon single crystal, melting the silicon single crystal facilitates the entry of the dopant into the substitution position, and the activation level can be increased more effectively.

The laser annealing is preferably performed with a laser irradiation time of 10 to 1000 nsec.

Since such an irradiation time is a short irradiation time, a laser-irradiated portion can be selectively heated.

The device forming method according to the third embodiment of the present invention described above controls the region for forming the diffusion layer to have an oxygen concentration of 5 ppma or more, and increases oxygen more than the amount of defect generated during the laser annealing. The defect formation can be suppressed, and the dopant activation level can be easily enhanced. Additionally, the device forming method according to the third embodiment of the present invention is suitably applicable to a case where a device is formed using an SOI substrate.

Note that, hereinabove, the description has been given of the case where the step of controlling the region for forming the diffusion layer to have an oxygen concentration of 5 ppma or more (S32 in FIG. 3) is performed before the step of forming the diffusion layer by ion-implanting the dopant (S33 in FIG. 3). Nevertheless, it is only necessary that the step of controlling the region for forming the diffusion layer to have an oxygen concentration of 5 ppma or more should be performed before the step of activating the diffusion layer by laser annealing (S34 in FIG. 3). The step of controlling the region for forming the diffusion layer to have an oxygen concentration of 5 ppma or more may be performed after the step of forming the diffusion layer by ion-implanting the dopant. For example, the oxygen-containing ions may be implanted before the dopant ion implantation or after the dopant ion implantation.

EXAMPLE

Hereinafter, the present invention will be more specifically described with reference to Experimental Examples, Example, and Comparative Example. However, the present invention is not limited thereto.

Experimental Examples 1, 2

Prepared were: epitaxial wafers each having a low oxygen concentration (an epitaxial layer was formed on a silicon single crystal substrate, the oxygen concentration of the epitaxial layer: less than 0.05 ppma (JEIDA), the thickness of the epitaxial layer: 3 μm) (Experimental Example 1); and silicon single crystal substrates each having a high oxygen concentration (oxygen concentration: 13 ppma (JEIDA)) (Experimental Example 2).

The conductivity type, resistivity, diameter, and crystal axis orientation of the silicon single crystal substrates were as follows.
Conductivity type: p-type
Resistivity: 8 to 20 Ω·cm
Diameter: 300 mm
Crystal axis orientation: <100>

Next, arsenic was ion-implanted into the prepared epitaxial wafers and silicon single crystal substrates. The dose was $1\times10^{15}$ atoms/cm$^2$, and the energy was 20 keV. Then, to electrically activate the dopant, laser annealing was performed. The laser wavelength was 308 nm, the laser pulse width was 150 ns, and the laser energy was 2.5 to 3.7 J/cm$^2$. The laser irradiation was performed at room temperature in an air atmosphere. Thereafter, the arsenic profile was measured by SIMS (Secondary Ion Mass Spectrometry). It was found that the profile was not influenced by oxygen.

Subsequently, the sheet resistance of the diffusion layers thus formed was measured. FIG. 4 shows the measurement result. In FIG. 4, a triangle (▲) indicates the epitaxial wafer having a low oxygen concentration (Experimental Example 1), and a circle (●) indicates the silicon single crystal substrate having a high oxygen concentration (Experimental Example 2). The sheet resistance of the epitaxial wafers each having a low oxygen concentration in the region for forming the diffusion layer was 90 to 115Ω/□, whereas that of the silicon single crystal substrates each having a high oxygen concentration was 40 to 50Ω/□. This revealed that the higher the oxygen concentration, the more electrically active (the lower the resistance).

Experimental Example 3

Silicon single crystal substrates varying in oxygen concentration from 2 to 13 ppma (JEIDA) were prepared.

The conductivity type, resistivity, diameter, and crystal axis orientation of the silicon single crystal substrates were as follows.
Conductivity type: p-type
Resistivity: 8 to 20 Ω·cm
Diameter: 300 mm
Crystal axis orientation: <100>

Next, arsenic was ion-implanted into the prepared silicon single crystal substrates to form diffusion layers. The dose was $1\times10^{15}$ atoms/cm$^2$, and the energy was 20 keV. Then, to electrically activate the dopant in the diffusion layers, laser annealing was performed. The laser wavelength was 308 nm, the laser pulse width was 150 ns, and the laser energy was 2.5 J/cm$^2$. The laser irradiation was performed at room temperature in an air atmosphere.

Subsequently, the sheet resistance of the diffusion layers thus formed was measured. FIG. 5 shows the measurement result. This revealed that it was possible to increase the electrical activation (i.e., decrease the resistance) by using the silicon single crystal substrate having an oxygen concentration of 5 ppma or more.

Example 1, Comparative Example 1

Epitaxial wafers were prepared (in each of which an epitaxial layer was formed on a silicon single crystal substrate, the oxygen concentration of the epitaxial layer: less than 0.1 ppma (JEIDA), the thickness of the epitaxial layer: 3 μm).

The conductivity type, resistivity, diameter, and crystal axis orientation of the silicon single crystal substrates were as follows.
Conductivity type: p-type
Substrate resistivity: 0.008 to 0.015 Ω·cm
Epitaxial layer resistivity: 1 to 2 Ω·cm
Diameter: 300 mm
Crystal axis orientation: <100>

Next, oxygen was ion-implanted into each epitaxial layer. The dose was $1\times10^{12}$ to $1.5\times10^{13}$ atoms/cm$^2$, and the energy was 40 keV. In this event, the average oxygen concentration from the surface of the epitaxial layer to a depth of 200 nm was 1 to 14 ppma (in Example 1, the average oxygen concentration was 5 to 14 ppma; in Comparative Example 1, the average oxygen concentration was 1 ppma). Then, arsenic was ion-implanting as a dopant into the epitaxial wafers to form diffusion layers. The dose was $1\times10^{15}$ atoms/cm$^2$, and the energy was 20 keV.

Next, to electrically activate the dopant in the diffusion layers, laser annealing was performed. The laser wavelength was 308 nm, the laser pulse width was 150 ns, and the laser energy was 2.5 J/cm$^2$. The laser irradiation was performed at room temperature in an air atmosphere. In this event, the diffusion layers each had a thickness of 200 nm or less.

Subsequently, the sheet resistance of the diffusion layers in the epitaxial wafers of Example 1 and Comparative Example 1 was measured. FIG. 6 shows the measurement result. In FIG. 6, a white circle (○) indicates the epitaxial wafer of Comparative Example 1, and a black circle (●) indicates the epitaxial wafer of Example 1. These revealed that it was possible to increase the electrical activation (i.e., decrease the resistance) by controlling the region for forming the diffusion layer in the epitaxial wafer to have an oxygen concentration of 5 ppma or more.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A device forming method comprising:
   forming a diffusion layer by ion-implanting a dopant into a silicon single crystal substrate; and
   activating the diffusion layer by laser annealing, wherein
   when the silicon single crystal substrate used has an oxygen concentration of less than 5 ppma in a region for forming the diffusion layer, the device forming method comprises a step of controlling the region for forming the diffusion layer to have an oxygen concentration of 5 ppma or more before the diffusion layer is activated by the laser annealing.

2. The device forming method according to claim 1, wherein any of an FZ silicon single crystal substrate, an MCZ silicon single crystal substrate, and a CZ silicon single crystal substrate having a DZ layer formed in an IG-treated surface region is used as the silicon single crystal substrate.

3. The device forming method according to claim 1, wherein as a method for controlling the region for forming the diffusion layer to have an oxygen concentration of 5 ppma or more, the silicon single crystal substrate is heated in an oxygen atmosphere, thereby inwardly diffusing oxygen into the region for forming the diffusion layer.

4. The device forming method according to claim 2, wherein as a method for controlling the region for forming the diffusion layer to have an oxygen concentration of 5 ppma or more, the silicon single crystal substrate is heated in an oxygen atmosphere, thereby inwardly diffusing oxygen into the region for forming the diffusion layer.

5. The device forming method according to claim 1, wherein as a method for controlling the region for forming the diffusion layer to have an oxygen concentration of 5 ppma or more, oxygen-containing ions are implanted into the silicon single crystal substrate, thereby making the region for forming the diffusion layer have an oxygen concentration of 5 ppma or more.

6. The device forming method according to claim 2, wherein as a method for controlling the region for forming the diffusion layer to have an oxygen concentration of 5 ppma or more, oxygen-containing ions are implanted into the silicon single crystal substrate, thereby making the region for forming the diffusion layer have an oxygen concentration of 5 ppma or more.

7. A device forming method comprising:
   forming a diffusion layer by ion-implanting a dopant into an epitaxial wafer having an epitaxial layer formed on a silicon single crystal substrate; and
   activating the diffusion layer by laser annealing, wherein
   the device forming method comprises a step of controlling a region for forming the diffusion layer to have an oxygen concentration of 5 ppma or more before the diffusion layer is activated by the laser annealing.

8. The device forming method according to claim 7, wherein as a method for controlling the region for forming the diffusion layer to have an oxygen concentration of 5 ppma or more,
   a silicon single crystal substrate having an oxygen concentration of 5 ppma or more is used, and
   a step of forming the epitaxial layer involves outwardly diffusing oxygen from the silicon single crystal substrate into the region for forming the diffusion layer.

9. The device forming method according to claim 7, wherein as a method for controlling the region for forming the diffusion layer to have an oxygen concentration of 5 ppma or more,
   a silicon single crystal substrate having an oxygen concentration of 5 ppma or more is used, and
   after the epitaxial layer is formed, the epitaxial wafer is heated in a non-oxidizing atmosphere, thereby outwardly diffusing oxygen from the silicon single crystal substrate into the region for forming the diffusion layer.

10. The device forming method according to claim 7, wherein as a method for controlling the region for forming the diffusion layer to have an oxygen concentration of 5 ppma or more, after the epitaxial layer is formed, the epitaxial wafer is heated in an oxygen atmosphere, thereby inwardly diffusing oxygen into the region for forming the diffusion layer.

11. The device forming method according to claim 7, wherein as a method for controlling the region for forming the diffusion layer to have an oxygen concentration of 5 ppma or more, after the epitaxial layer is formed, oxygen-containing ions are implanted into the epitaxial layer of the epitaxial wafer.

12. The device forming method according to claim 7, wherein as a method for controlling the region for forming the diffusion layer to have an oxygen concentration of 5 ppma or more, a step of forming the epitaxial layer involves doping the epitaxial layer with oxygen.

13. A device forming method comprising:
    forming a diffusion layer by ion-implanting a dopant into an SOI substrate; and
    activating the diffusion layer by laser annealing, wherein
    when the SOI substrate used includes an SOI layer having an oxygen concentration of less than 5 ppma, the device forming method comprises a step of controlling a region for forming the diffusion layer to have an oxygen concentration of 5 ppma or more before the diffusion layer is activated by the laser annealing.

14. The device forming method according to claim 13, wherein as a method for controlling the region for forming the diffusion layer to have an oxygen concentration of 5 ppma or more, the SOI substrate is heated in an oxygen atmosphere, thereby inwardly diffusing oxygen into the region for forming the diffusion layer.

15. The device forming method according to claim 13, wherein as a method for controlling the region for forming the diffusion layer to have an oxygen concentration of 5 ppma or more, oxygen-containing ions are implanted into the SOI layer of the SOI substrate.

16. The device forming method according to claim 1, wherein the dopant contains any one element of boron, aluminum, gallium, phosphorus, arsenic, and antimony.

17. The device forming method according to claim 1, wherein the dopant is ion-implanted at a dose of $1 \times 10^{12}$ atoms/cm$^2$ or more.

18. The device forming method according to claim 1, wherein the laser annealing uses an excimer laser having a wavelength of 308 nm.

19. The device forming method according to claim 1, wherein the laser annealing is performed with a laser energy greater than an energy for melting a silicon single crystal.

20. The device forming method according to claim 1, wherein the laser annealing is performed with a laser irradiation time of 10 to 1000 nsec.

\* \* \* \* \*